US 8,816,418 B2

(12) United States Patent
Kim et al.

(10) Patent No.: US 8,816,418 B2
(45) Date of Patent: Aug. 26, 2014

(54) SEMICONDUCTOR MEMORY DEVICES AND METHODS OF FABRICATING THE SAME

(75) Inventors: Hyongsoo Kim, Gyeonggi-do (KR); Eunkee Hong, Gyeonggi-do (KR); Kwangtae Hwang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 50 days.

(21) Appl. No.: 13/617,148

(22) Filed: Sep. 14, 2012

(65) Prior Publication Data

US 2013/0105873 A1     May 2, 2013

(30) Foreign Application Priority Data

Oct. 31, 2011    (KR) .................... 10-2011-0112404

(51) Int. Cl.
*H01L 27/108* (2006.01)
*H01L 29/94* (2006.01)
*H01L 29/66* (2006.01)

(52) U.S. Cl.
CPC .............. *H01L 27/108* (2013.01); *H01L 29/94* (2013.01); *H01L 29/66* (2013.01)
USPC ............ 257/296; 257/303; 257/423; 257/557

(58) Field of Classification Search
CPC ....................................................... H01L 29/94
USPC ......................................... 257/296, 303, 532
See application file for complete search history.

(56) References Cited

U.S. PATENT DOCUMENTS

| | | | |
|---|---|---|---|
| 6,249,019 B1 * | 6/2001 | Sandhu et al. | 257/309 |
| 6,342,419 B1 * | 1/2002 | Tu | 438/253 |
| 2002/0004280 A1 * | 1/2002 | Park | 438/396 |
| 2003/0148581 A1 * | 8/2003 | Kim et al. | 438/253 |
| 2004/0217406 A1 * | 11/2004 | Chung et al. | 257/304 |
| 2005/0130385 A1 * | 6/2005 | Lee et al. | 438/399 |
| 2005/0176210 A1 * | 8/2005 | Kim et al. | 438/386 |
| 2005/0245026 A1 | 11/2005 | Kim et al. | |
| 2005/0287738 A1 | 12/2005 | Cho et al. | |
| 2006/0281246 A1 | 12/2006 | Tegen | |
| 2008/0265299 A1 * | 10/2008 | Bulsara et al. | 257/301 |

FOREIGN PATENT DOCUMENTS

| | | |
|---|---|---|
| JP | 2006-013516 | 1/2006 |
| JP | 2006-287229 | 10/2006 |
| KR | 10-2005-0092466 A | 9/2005 |
| KR | 10-0539268 B1 | 12/2005 |
| KR | 10-2006-0105543 A | 10/2006 |
| KR | 10-0753711 | 8/2007 |

* cited by examiner

*Primary Examiner* — Long K Tran
*Assistant Examiner* — Dzung Tran
(74) *Attorney, Agent, or Firm* — Lee & Morse, P.C.

(57) ABSTRACT

A semiconductor memory device includes at least one supporting pattern on a substrate, a storage node penetrating the supporting pattern, an electrode layer disposed around the storage node and the supporting pattern, and a capacitor dielectric interposed between the storage node and the electrode layer. The supporting pattern includes germanium oxide.

16 Claims, 15 Drawing Sheets

SEMICONDUCTOR MEMORY DEVICES AND METHODS OF FABRICATING THE SAME

CROSS-REFERENCE TO RELATED APPLICATIONS

Korean Patent Application No. 10-2011-0112404, filed on Oct. 31, 2011, in the Korean Intellectual Property Office and entitled "Semiconductor Memory Devices and Methods of Fabricating the Same," is incorporated herein by reference in its entirety.

BACKGROUND

Embodiments relate generally to a semiconductor memory device and a method of fabricating the same. More particularly, embodiments relate to a semiconductor memory device including capacitors and a method of fabricating the same.

SUMMARY

According to an embodiment, there is provided a semiconductor memory device including at least one supporting pattern on a substrate, a storage node penetrating the supporting pattern, an electrode layer disposed around the storage node and the supporting pattern, and a capacitor dielectric interposed between the storage node and the electrode layer. The supporting pattern includes germanium oxide.

The supporting pattern may include a first supporting pattern in contact with an intermediate portion of the storage node and a second supporting pattern in contact with a top portion of the storage node.

A top surface of the second supporting pattern may be coplanar with a top surface of the top portion of the storage node.

The supporting pattern may have an opening. The capacitor dielectric may be present on a sidewall of the opening. A thickness of the capacitor dielectric on the sidewall of the opening may be smaller than half a width of the opening.

The storage node may have a cylindrical shape.

The semiconductor memory device may further include an etch stop layer on the substrate, a bottom surface of the etch stop layer being coplanar with a bottom surface of the storage node, and the etch stop layer being of a material different from that of the supporting pattern.

The etch stop layer may include a silicon nitride layer.

The semiconductor memory device may further include a transistor between the substrate and the storage node. The storage node may be electrically connected to the transistor.

According to an embodiment, there is provided a method of fabricating a semiconductor memory device including forming a mold layer on a substrate, forming a supporting pattern on the mold layer, forming storage nodes on the substrate to penetrate the supporting pattern and the mold layer, removing the mold layer, forming a capacitor dielectric on the substrate to conformally cover the storage nodes, and forming an electrode layer on the substrate. The mold layer is formed of a layer containing silicon oxide and the supporting pattern is formed of a layer containing germanium oxide.

The supporting pattern may be formed to define an opening. The capacitor dielectric may be formed on a sidewall of the opening in a thickness that is smaller than half a width of the opening.

The forming of the storage nodes may include forming through holes to penetrate the supporting pattern and the mold layer, forming a storage electrode layer on the substrate to conformally cover inner surfaces of the through holes, and etching the storage electrode layer to form the storage nodes localized in the through holes, respectively.

The method may further include forming an etch stop layer before the forming of the mold layer. The forming of the through holes may include etching the etch stop layer. A width of each of the through holes may be greater at a level of the etch stop layer than at a level of the supporting pattern. The etch stop layer may be formed of a material different from that of the mold layer and the supporting pattern.

The method may further include sequentially forming an upper mold layer and an upper supporting pattern on the supporting pattern, before forming the storage nodes. At least one of the supporting pattern and the upper supporting pattern is formed of a germanium oxide layer.

The removing of the mold layer may include wet etching using an etchant containing hydrofluoric acid.

According to an embodiment, there is provided a semiconductor memory device including a plurality of storage nodes extending perpendicularly from a substrate, at least one supporting pattern spaced apart from and parallel to the substrate, the supporting pattern being made of germanium oxide, and the supporting pattern surrounding the storage nodes at a portion thereof and including openings between predetermined ones of the storage nodes, an electrode layer disposed around the storage nodes and the supporting pattern, and a capacitor dielectric interposed between the storage nodes and the electrode layer and between the supporting pattern and the electrode layer.

The supporting pattern may include a first supporting pattern in contact with an intermediate portion of the storage nodes and a second supporting pattern in contact with a top portion of the storage nodes.

Bottom surfaces of the storage nodes may contact top surfaces of contact plugs in the substrate.

The semiconductor memory device may further include an etch stop layer on the substrate. A lower surface of the etch stop layer may be coplanar with the bottom surfaces of the storage node, and the etch stop layer being made of silicon nitride.

BRIEF DESCRIPTION OF THE DRAWINGS

Features will become apparent to those of ordinary skill in the art by describing in detail exemplary embodiments with reference to the attached drawings in which.

Figure 1A:
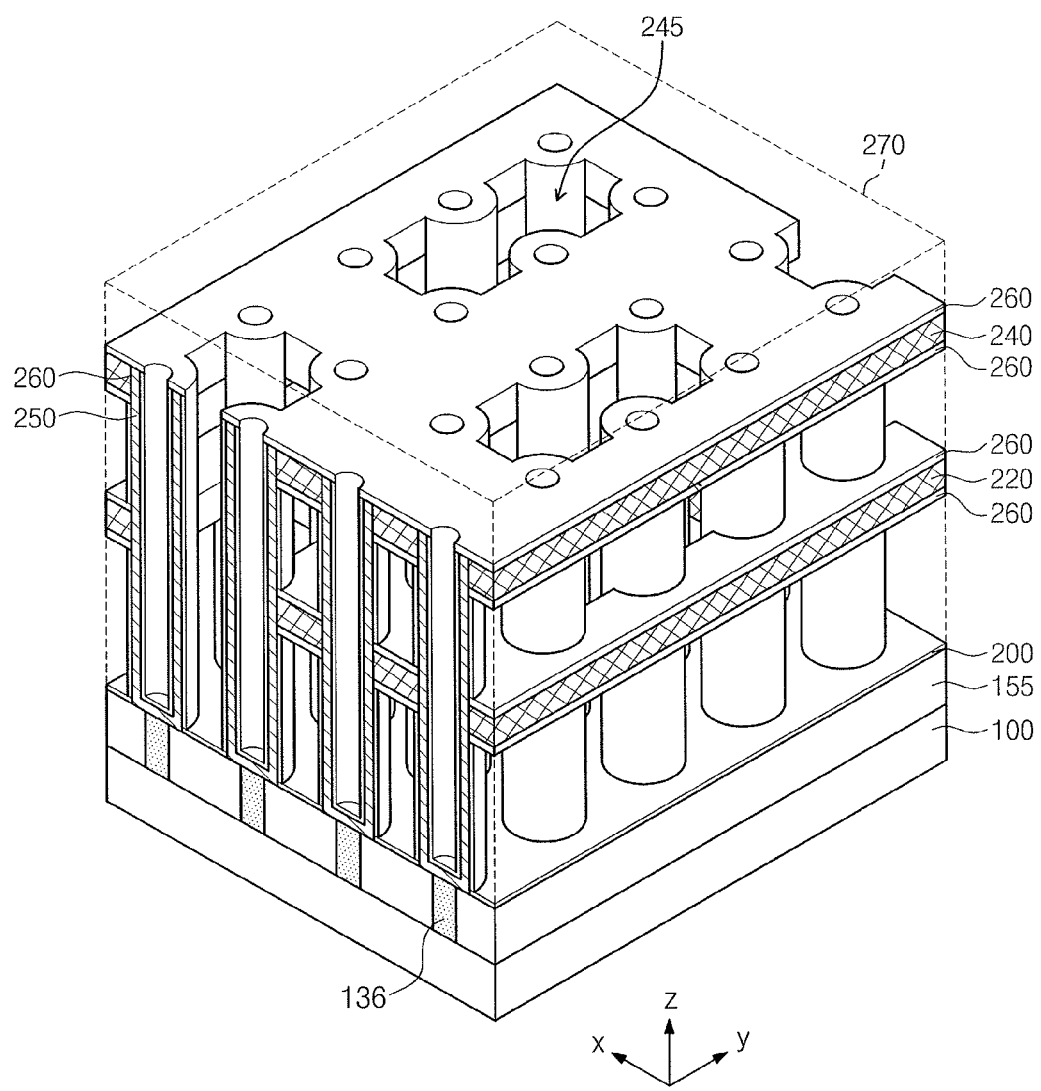
FIG. 1A illustrates a perspective view of a semiconductor memory device according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments may be described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a semiconductor memory device according to example embodiments will be described with reference to the accompanying drawings. FIG. 1A illustrates a perspective view of a semiconductor memory device according to example embodiments, FIG. 1B illustrates a plan view of a semiconductor memory device according to example embodiments, and FIG. 1C illustrates a sectional view taken along a line I-I' of FIG. 1B.

Figure 1B:
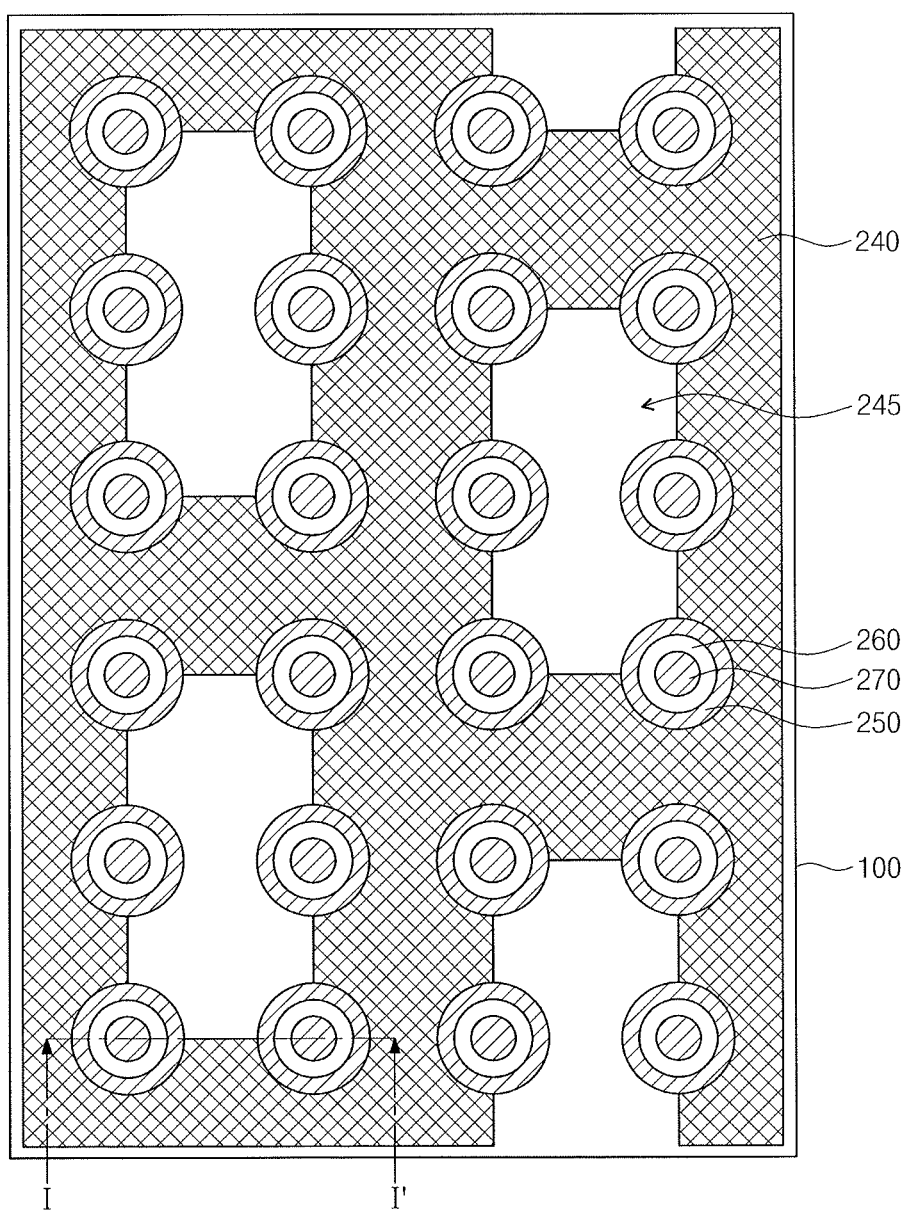
FIG. 1B illustrates a plan view of a semiconductor memory device according to example embodiments.
Figure 1C:
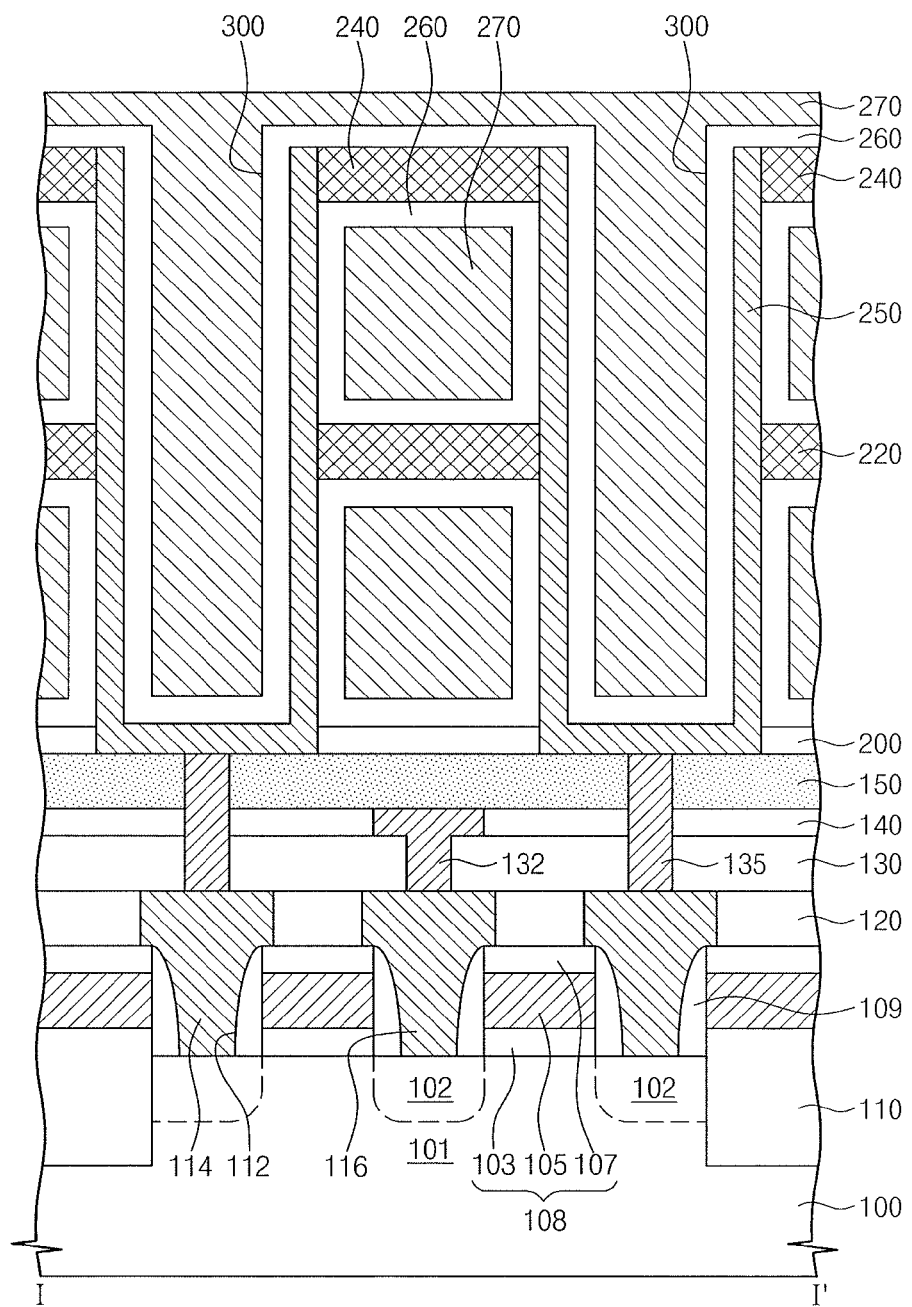
FIG. 1C illustrates a sectional view taken along a line I-I' of FIG. 1B.

Referring to FIGS. 1A through 1C, an interlayer dielectric 155 may be provided on a substrate 100. Contact plugs 136 may be provided on the substrate 100 to penetrate the interlayer dielectric 155.

A bit line 132 may be provided in the interlayer dielectric 155 to cross word line patterns 108. In some embodiments, the bit line 132 may not be located on the line I-I' of FIG. 1B, unlike in FIG. 1C. The bit line 132 may be electrically connected to a bit line contact plug 116 via a bit line contact hole penetrating the interlayer dielectric 155.

Storage nodes 250 may be provided on the interlayer dielectric 155. Each of the storage nodes 250 may be electrically connected to a corresponding one of the contact plugs 136. A bottom surface of the storage node 250 may be in contact with a top surface of the contact plug 136. An etch stop layer 200 may be provided on the interlayer dielectric 155. A bottom surface of the etch stop layer 200 may be coplanar with the bottom surface of the storage node 250.

In some embodiments, each of the storage nodes 250 may be formed to have a cylindrical structure. For example, each of the storage nodes 250 may include a plate portion parallel to the substrate 100 and a sidewall portion upward extending from an edge of the plate portion. The storage nodes 250 may include a conductive material.

An electrode layer 270 may be provided on the interlayer dielectric 155 to cover the storage nodes 250. The electrode layer 270 may include a conductive material.

A capacitor dielectric 260 may be provided between the storage nodes 250 and the electrode layer 270. The capacitor dielectric 260 may be disposed to cover a surface of the storage node 250.

First and second supporting patterns 220 and 240 may be provided on the interlayer dielectric 155. In some embodiments, the first and second supporting patterns 220 and 240 may be in contact with at least a portion of the sidewall portion of the storage nodes 250, such that the storage nodes 250 can be laterally supported by the first and second supporting patterns 220 and 240. In some embodiments, the first and second supporting patterns 220 and 240 may be provided in the electrode layer 270.

The first and second supporting patterns 220 and 240 may include a plurality of openings 245. Each of the openings 245 may be formed to expose a plurality of the storage nodes 250. That is, each of the openings 245 may be formed to surround the plurality of the storage nodes 250. But example embodiments may not be limited thereto, and structures of the first and second supporting patterns 220 and 240 may be variously modified.

In the semiconductor memory device according to example embodiments, the storage nodes 250 may be supported by the first and second supporting patterns 220 and 240, which may include a layer of germanium oxide. Hereinafter, a method of fabricating a semiconductor memory device according to example embodiments will be described in detail with reference to the accompanying drawings.

FIGS. 2 through 11 illustrate sectional views depicting stages of a method of fabricating a semiconductor memory device according to example embodiments.

Figure 2:
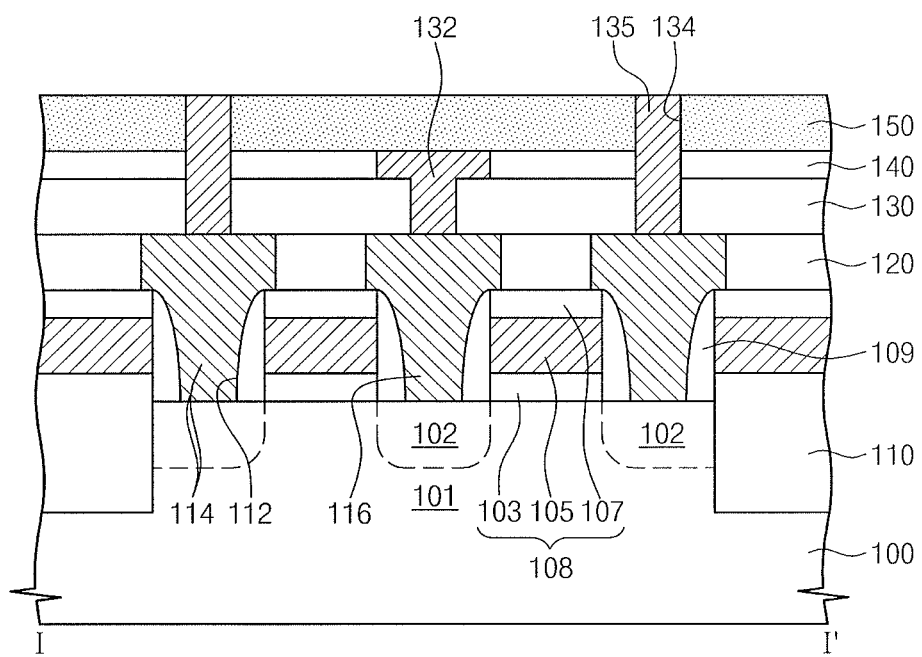
FIGS. 2 through 11 illustrate sectional views depicting stages of a method of fabricating a semiconductor memory device according to example embodiments.

Referring to FIG. 2, a device isolation layer 110 may be formed on a substrate 100 to define an active region 101. The substrate 100 may include a semiconductor material. For example, the substrate 100 may include at least one of silicon, silicon-germanium and/or germanium. The device isolation layer 110 may include an insulating material (e.g., a silicon oxide layer).

A word line pattern 108 may be formed on the substrate 100. The formation of the word line pattern 108 may include sequentially forming a gate insulating layer, a gate conductive layer, and a capping insulating layer on the substrate 100 provided with the device isolation layer 110, and then, patterning them to form a gate insulating layer pattern 103, a gate pattern 105, and a capping insulating layer pattern 107 sequentially stacked on the substrate 100. The word line pattern 108 may be formed to cross the active region 101 and the device isolation layer 110.

An insulating spacer 109 may be formed on a sidewall of the word line pattern 108. The formation of the insulating spacer 109 may include conformally forming an insulating layer on the entire surface of the substrate 100 and then anisotropically etching the insulating layer. In some embodiments, the insulating spacer 109 may include a layer of silicon nitride.

Doped regions 102 may be formed in the active region 101. The doped regions 102 may be formed by injecting dopants into the active region 101 using the word line pattern 108 and the insulating spacer 109 as an ion-implantation mask. In some embodiments, the doped regions 102 may serve as source and/or drain regions of cell transistors.

First contact holes 112 may be formed on the substrate 100. The formation of the first contact holes 112 may include forming an insulating layer 120 on the substrate 100 and patterning the insulating layer 120 to expose the doped regions 102. The insulating layer 120 may include at least one layer of oxide, nitride and/or oxynitride. The first contact holes 112 may be formed using the insulating spacer 109 and the capping insulating layer pattern 107 as an etch stop layer. Next, first contact plugs 114 may be formed in the first contact holes 112, respectively. The formation of the first contact plugs 114 may include forming a conductive layer to fill the first contact holes 112 and planarizing the conductive layer to expose a top surface of the insulating layer 120.

First and second dielectrics 130 and 140 may be sequentially formed on the substrate 100 provided with the first contact plug 114. A bit line 132 may be formed in the first and second dielectrics 130 and 140 to cross the word line pattern 108. In some embodiments, the bit line 132 may not be located on the line I-I' of FIG. 1B, unlike in FIG. 2. The bit line 132 may be electrically connected to a bit line contact plug 116 via a bit line contact hole penetrating the first dielectric 130. In some embodiments, the bit line 132 may be formed using a damascene process. A third dielectric 150 may be formed on the substrate provided with the bit line 132.

The first dielectric 130 may be formed of a silicon oxide layer (e.g., of $SiO_2$), and the second and third dielectrics 140 and 150 may be formed of a silicon nitride layer (e.g., of SiN), a silicon carbonitride layer (e.g., of SiCN), or a silicon oxynitride layer (e.g., SiON). The first to third dielectrics 130, 140 and 150 may be selected to have different etch rates from each other. The combination of the first to third dielectrics 130, 140, 150 is depicted schematically in FIG. 1A as the dielectric 155.

A photo mask may be formed on the third dielectric 150, and second contact holes 134 may be formed on some of the first contact plugs 114 that are not electrically connected to the bit line 132. Thereafter, a conductive layer may be formed to fill the second contact holes 134, and the conductive layer may be etched back to expose a top surface of the third dielectric 150. As a result, second contact plugs 135 may be formed to fill the second contact holes 134, respectively. The conductive layer may be formed of a titanium nitride layer (e.g., TiN). The second contact plugs 135 may be electrically connected to the first contact plugs 114. The combination of the first contact plugs 114 and the second contact plugs 135 is depicted schematically in FIG. 1A as the contact plugs 136.

The first and second contact plugs 114 and 135 may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum).

Figure 3:
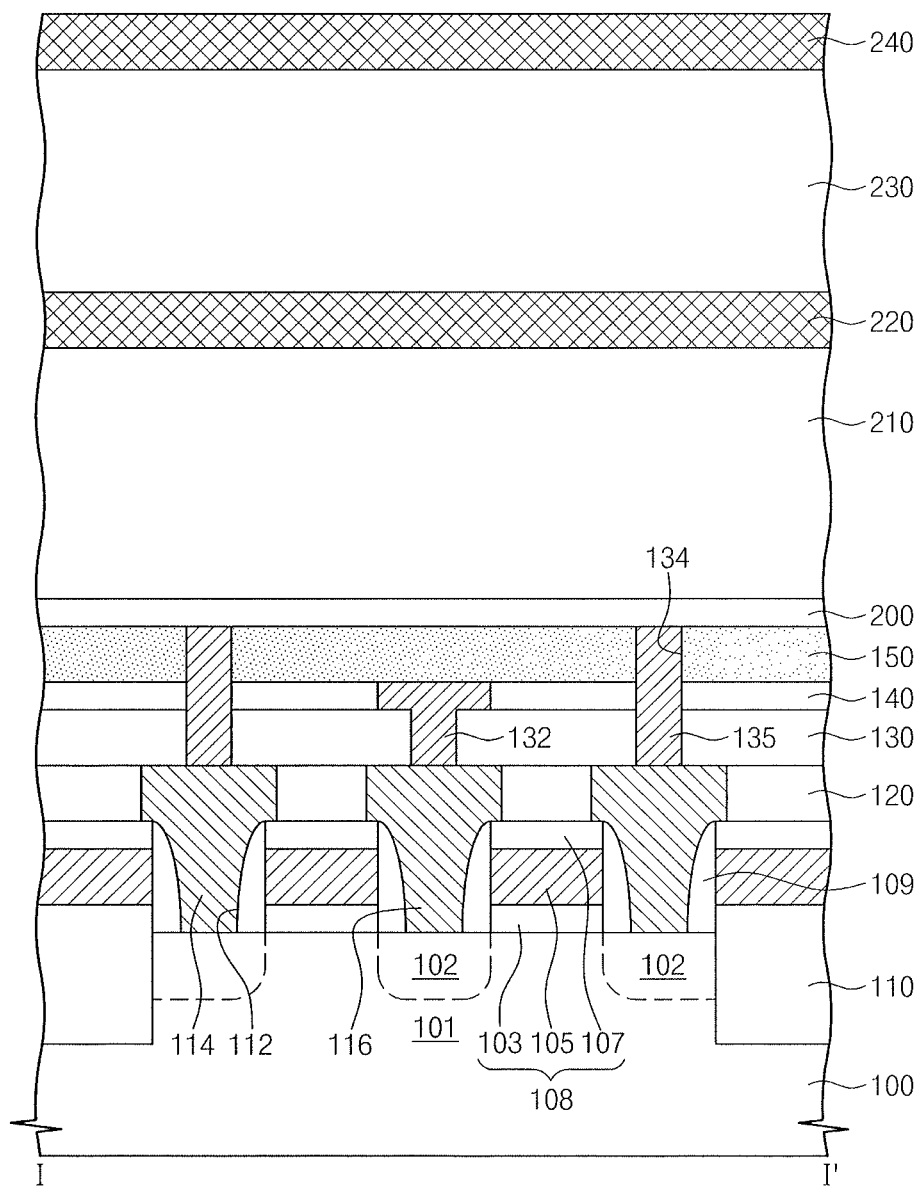

Referring to FIG. 3, an etch stop layer 200, a first mold layer 210, a first supporting pattern 220, a second mold layer 230, and a second supporting pattern 240 may be sequentially formed on the substrate 100. The etch stop layer 200 may be a silicon nitride (e.g., SiN) layer. In some embodiments, the etch stop layer 200 may be omitted. Each of the first and second mold layers 210 and 230 may include a layer of silicon oxide. Each of the first and second supporting patterns 220 and 240 may include a layer of germanium oxide.

In some embodiments, due to the presence of the first and second supporting patterns 220 and 240, storage nodes 250 to be subsequently formed can be prevented from falling. The first and second supporting patterns 220 and 240 may be formed to have a plurality of openings 245 as shown in FIG. 1. The shapes of the first and second supporting patterns 220 and 240 may be variously modified.

Figure 4:
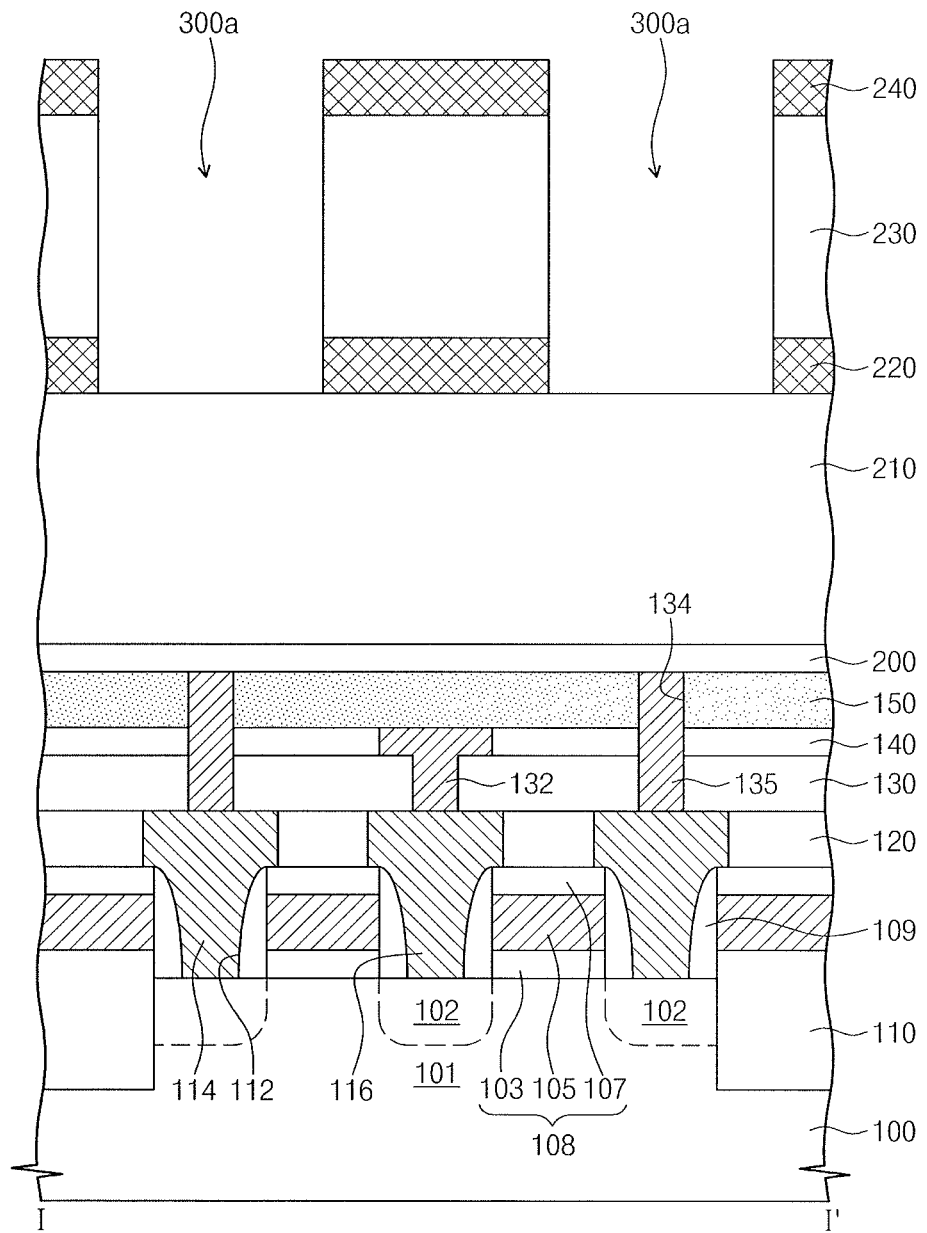

Referring to FIG. 4, the second supporting pattern 240, the second mold layer 230, and the first supporting pattern 220 may be patterned to form first openings 300a exposing the first mold layer 210. The formation of the first openings 300a may include forming a photo mask (not shown) on the second supporting pattern 240, and sequentially etching the second supporting pattern 240, the second mold layer 230, the first supporting pattern 220 using the photo mask as an etch-mask.

In some embodiments, during the formation of the first openings 300a, all of the second supporting pattern 240, the second mold layer 230, and the first supporting pattern 220 may be etched in a single etching chamber. In other implementations, during the formation of the first openings 300a, the second supporting pattern 240, the second mold layer 230, and the first supporting pattern 220 may be etched in different etching chambers.

Figure 5:
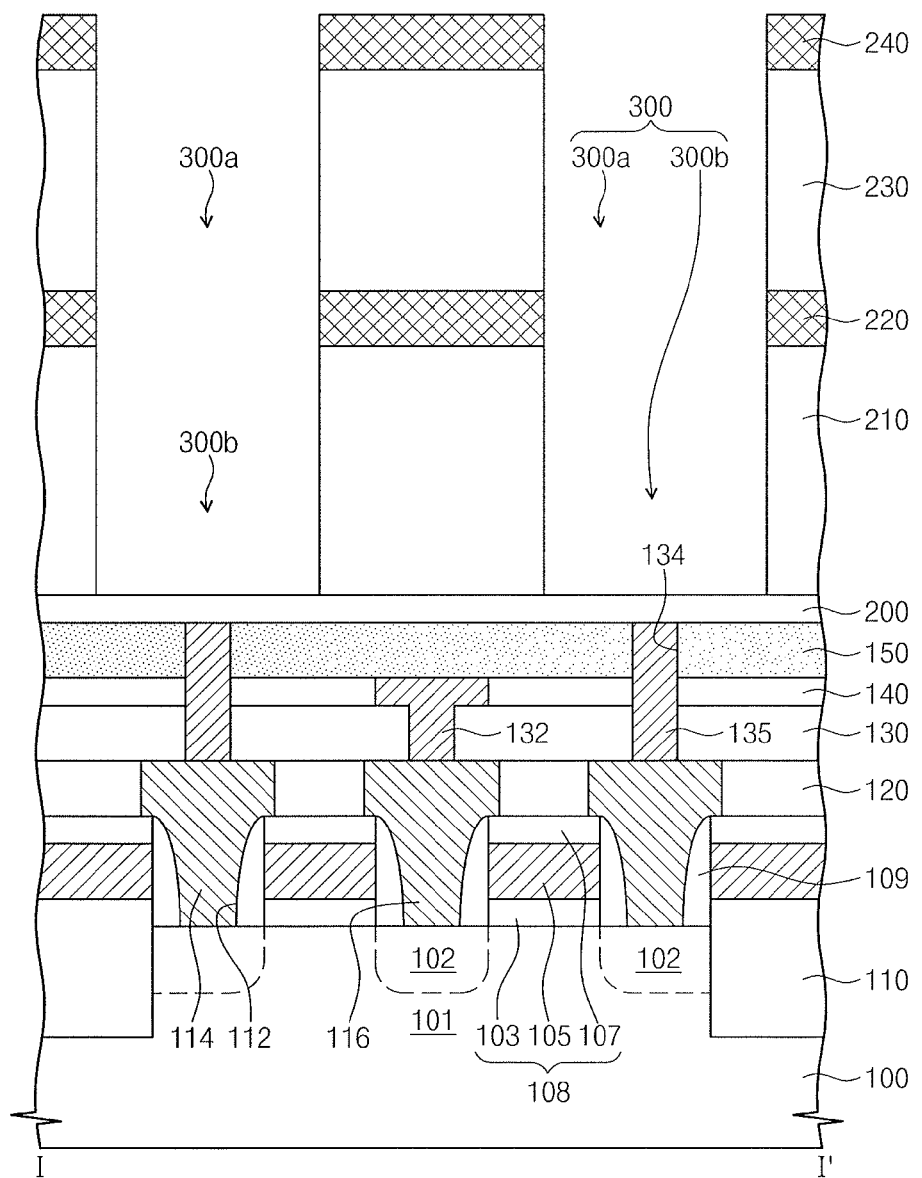

Referring to FIG. 5, second openings 300b may be formed on the substrate 100. The second openings 300b may be formed by etching the first mold layer 210 exposed by the first openings 300a. In some embodiments, the second openings 300b may be formed to expose the etch stop layer 200. The first and second openings 300a and 300b may constitute through holes 300. In some embodiments, the through holes 300 may be shaped like a pin hole. However, in other implementations, a shape of the through hole 300 may be variously modified.

Figure 6:
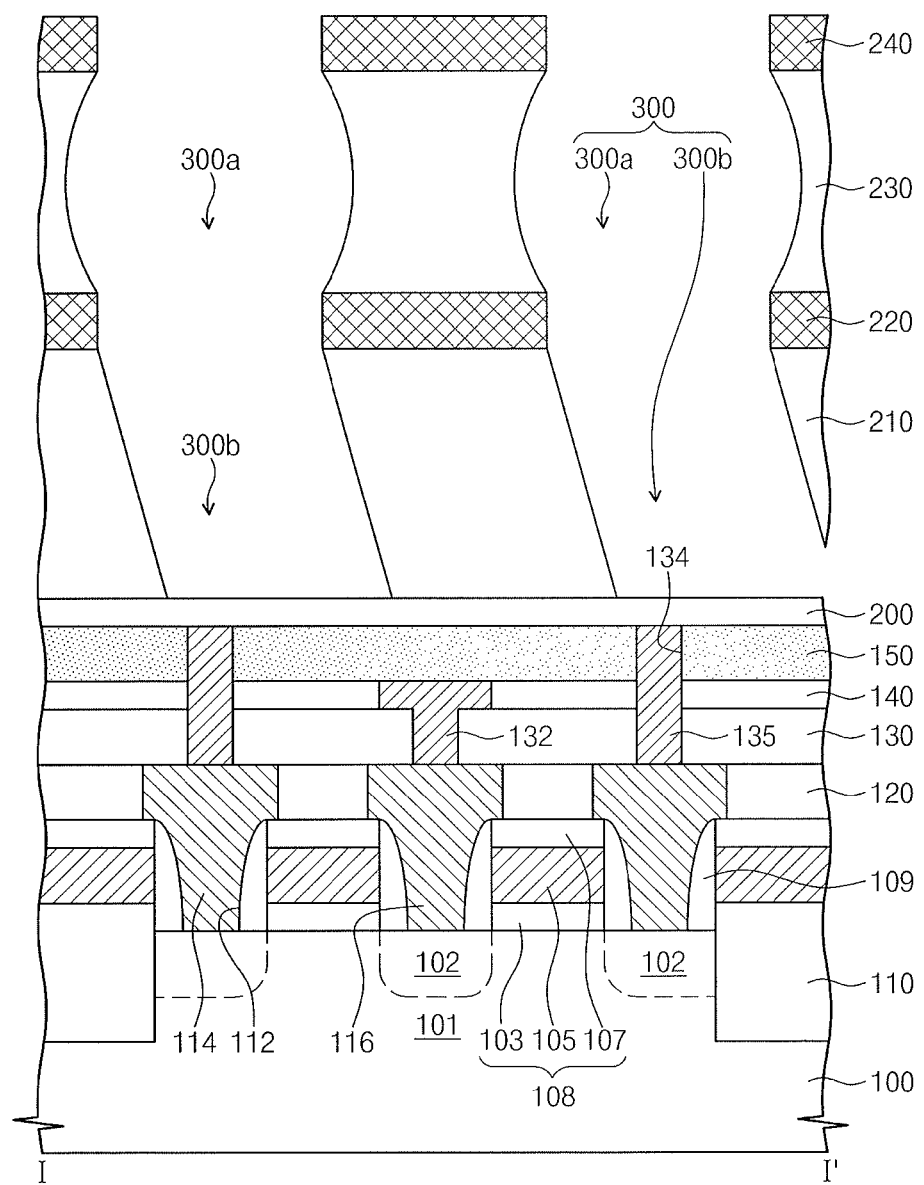

In comparative embodiments, as shown in FIG. 6, a bowing phenomenon may occur during sequential etching of the second supporting pattern 240, the second mold layer 230, the first supporting pattern 220, and the first mold layer 210 in a dry etching manner. For example, if the first and second supporting patterns 220 and 240 are different from the first and second mold layers 210 and 230 in terms of types of materials (especially, with regard to etch rates in the sequential dry etching processes), widths of the through hole 300 defined by the first and second supporting patterns 220 and 240 may be different from those defined by the first and second mold layers 210 and 230.

In more detail, if each of the first and second supporting patterns 220 and 240 were to include a layer of silicon nitride, the first and second mold layers 210 and 230 of silicon oxide could be more deeply etched, compared with the first and second supporting patterns 220 and 240. As a result, the width of the through hole 300 could be greater around the first and second mold layers 210 and 230 than around the first and second supporting patterns 220 and 240, such that the width of the through hole 300 may not be uniform. A spacing between the adjacent storage nodes 250 of FIG. 1A may be reduced by the bowing phenomenon, and this may result in an increase in a leakage current between the storage nodes 250 of FIG. 1A.

In other comparative embodiments, a tilting phenomenon may occur during sequential etching of the second supporting pattern 240, the second mold layer 230, the first supporting pattern 220, and the first mold layer 210. For example, the first and second supporting patterns 220 and 240 of silicon nitride may be etched at different etching rate from the first and second mold layers 210 and 230 of silicon oxide, such that the through holes 300 may be formed to have a leaned sidewall. The tilting phenomenon may result in a misalignment and/or contact failure between the second contact plugs 135 and the storage nodes 250, and result in a reduction in yield of the semiconductor memory device.

By contrast, according to the afore described embodiments described with reference to FIG. 5, the first and second supporting patterns 220 and 240 may be formed of germanium oxide. In this case, the first and second supporting patterns 220 and 240 and the second mold layer 230 are formed of oxide materials. Accordingly, it may be possible to prevent the bowing and tilting phenomenon from occurring. In addition, the first and second supporting patterns 220 and 240 of germanium oxide may not be removed in a subsequent process of removing the first and second mold layers 210 and 230, such that the first and second supporting patterns 220 and 240 may serve as elements supporting the storage nodes 250.

Figure 7:
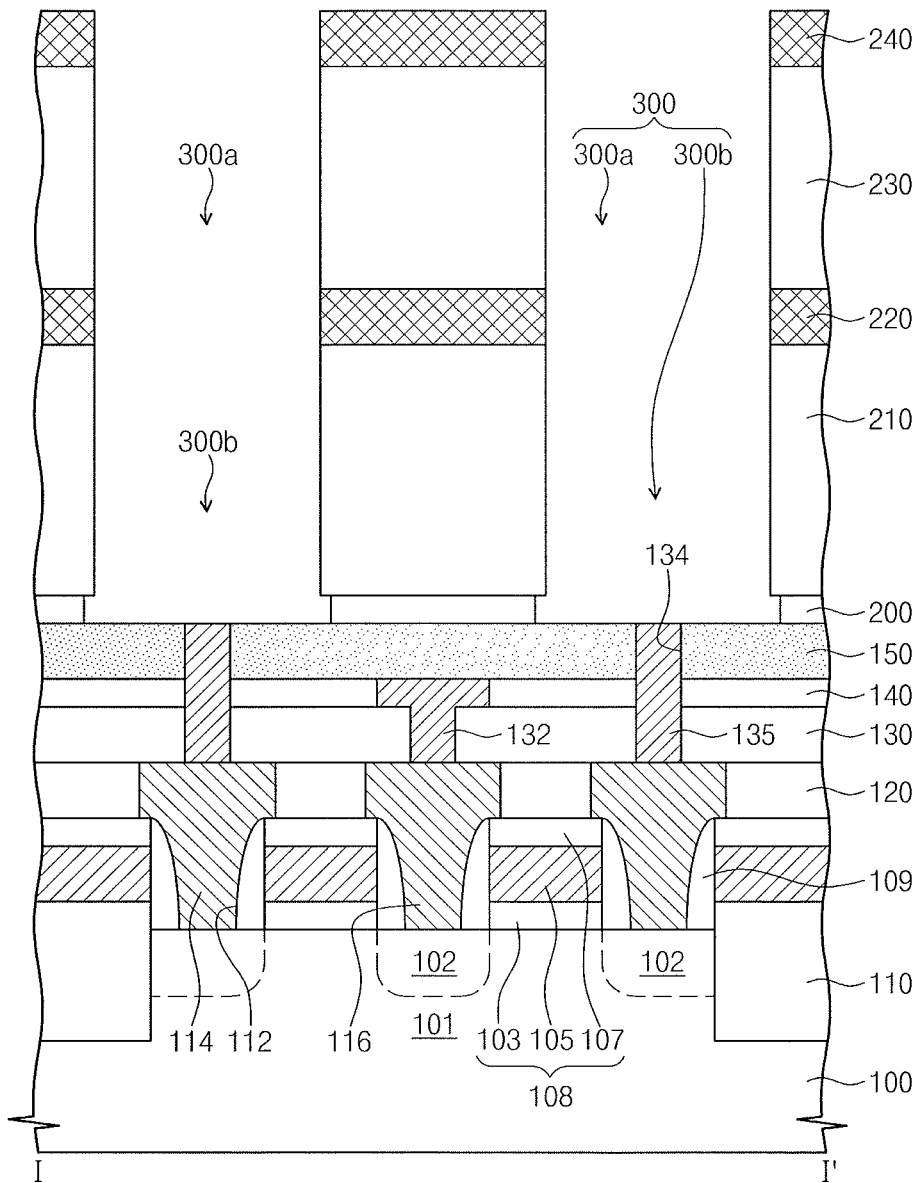

Referring to FIG. 7, the etch stop layer 200 may be etched to expose the second contact plugs 135. A region exposed by the etching of the etch stop layer 200 may be wider than the through hole 300, thereby increasing contact areas between the storage nodes 250, which will be provided in the through holes 300, and the second contact plugs 135.

If the etch stop layer 200 were to be formed of the same material as the first and second supporting patterns 220 and 240, the first and second supporting patterns 220 and 240 could be also etched during the etching of the etch stop layer 200. Accordingly, a width of the through hole 300 could be greater at levels of the first and second supporting patterns 220 and 240 than at levels of the first and second mold layers 210 and 230, and this could lead to a failure in a deposition process for forming the storage nodes 250.

According to example embodiments, on the other hand, the first and second supporting patterns 220 and 240 may be formed of a different material from the etch stop layer 200, and thus, it may be possible to prevent the first and second supporting patterns 220 and 240 from being etched during the etching of the etch stop layer 200. For example, the first and second supporting patterns 220 and 240 may include a layer of germanium oxide, and the etch stop layer 200 may include a layer of silicon nitride.

Figure 8:
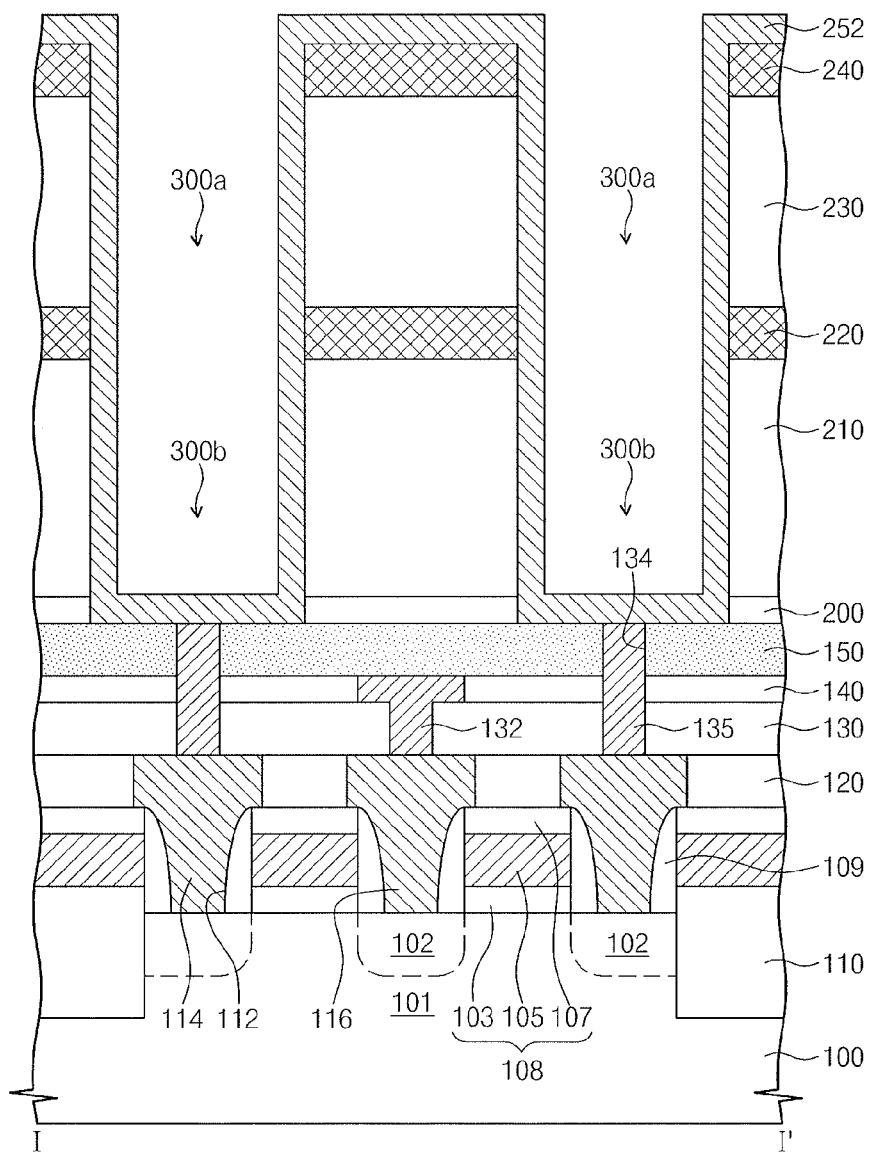

Referring to FIG. 8, a storage electrode layer 252 may be conformally formed on the substrate 100 provided with the through holes 300. The storage electrode layer 252 may be formed to cover inner surfaces of the through holes 300 and a top surface of the second supporting pattern 240.

The storage electrode layer 252 may be formed using a physical vapor deposition process or a chemical vapor deposition process. The storage electrode layer 252 may include at least one of a doped semiconductor layer, a conductive metal nitride layer (e.g., of titanium nitride, tantalum nitride, or tungsten nitride), a metal layer (e.g., of ruthenium, iridium, titanium, or tantalum), and a conductive metal oxide layer (e.g., of iridium oxide).

Figure 9:
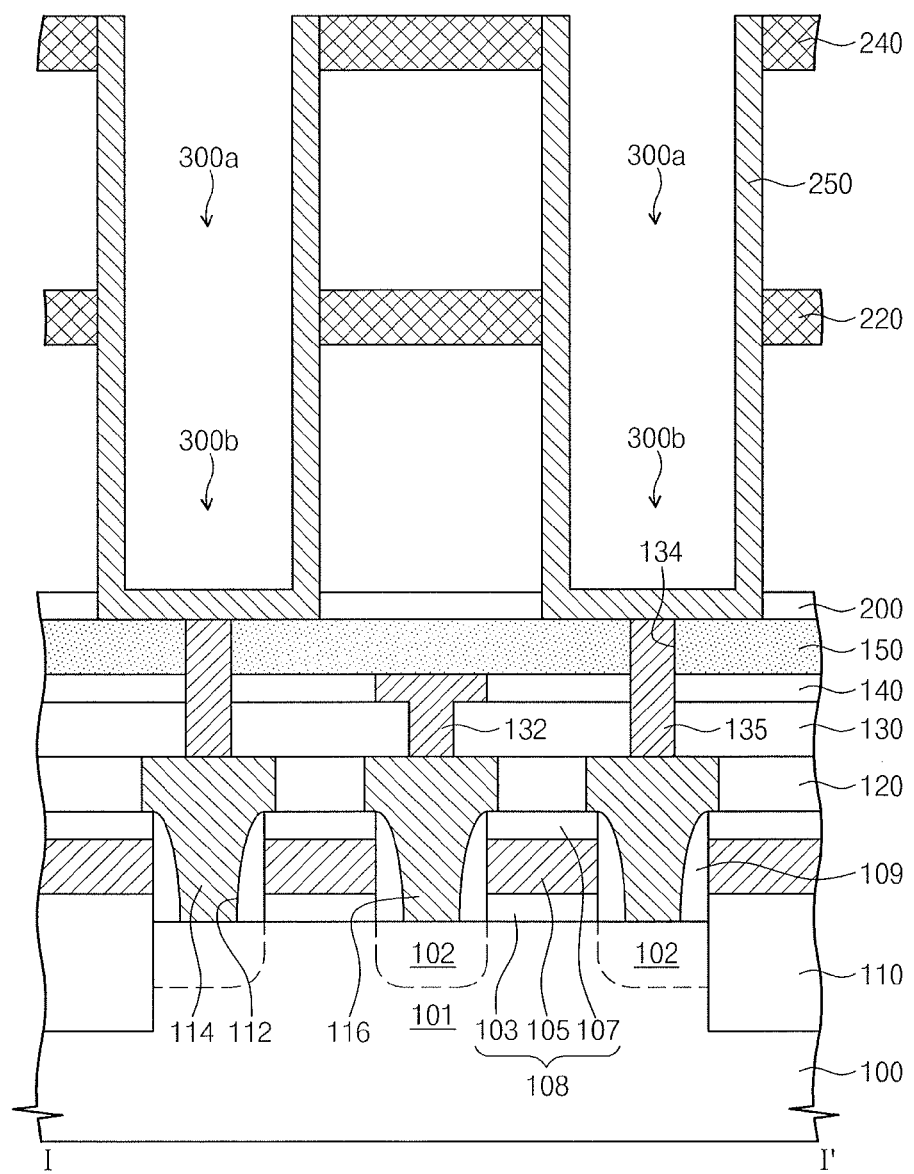

Referring to FIG. 9, a sacrificial layer may be formed in the through holes 300 and may be etched to expose a top surface of the second supporting pattern 240. As a result, the storage nodes 250 may be formed in the through holes 300, respectively. In some embodiments, the etching of the sacrificial layer may be performed using a chemical-mechanical polishing technique. The sacrificial layer may be formed of the same material as the first and second mold layers 210 and 230.

Each of the storage nodes 250 provided in the through holes 300, respectively, may be electrically connected to the corresponding one of the second contact plugs 135. The storage nodes 250 may be localized in the through holes 300, respectively, such that they may be spaced apart from each other.

Thereafter, the sacrificial layer, the first mold layer 210, and the second mold layer 230 may be removed. The removal process may include supplying an etchant through the opening (depicted by the reference numeral 245 of FIG. 1) of the first and second supporting patterns 220 and 240. As the result of the removal of the first mold layer 210 and the second mold layer 230, sidewalls of the storage nodes 250 and a surface of the first supporting pattern 220 may be exposed.

In some embodiments, the sacrificial layer and the first and second mold layers 210 and 230 may be removed by an etching process using a solution containing ammonium fluoride (NH₄F) and hydrofluoric acid (HF) as the etchant. The sacrificial layer and the first and second mold layers 210 and 230 may be removed by a single etching process or by several etching processes designed to selectively etch the sacrificial layer and the first and second mold layers 210 and 230. In some embodiments, a process of removing a by-product or remaining substance may be further performed, after the exposure of the first and second supporting pattern 220 and 240.

Figure 10:
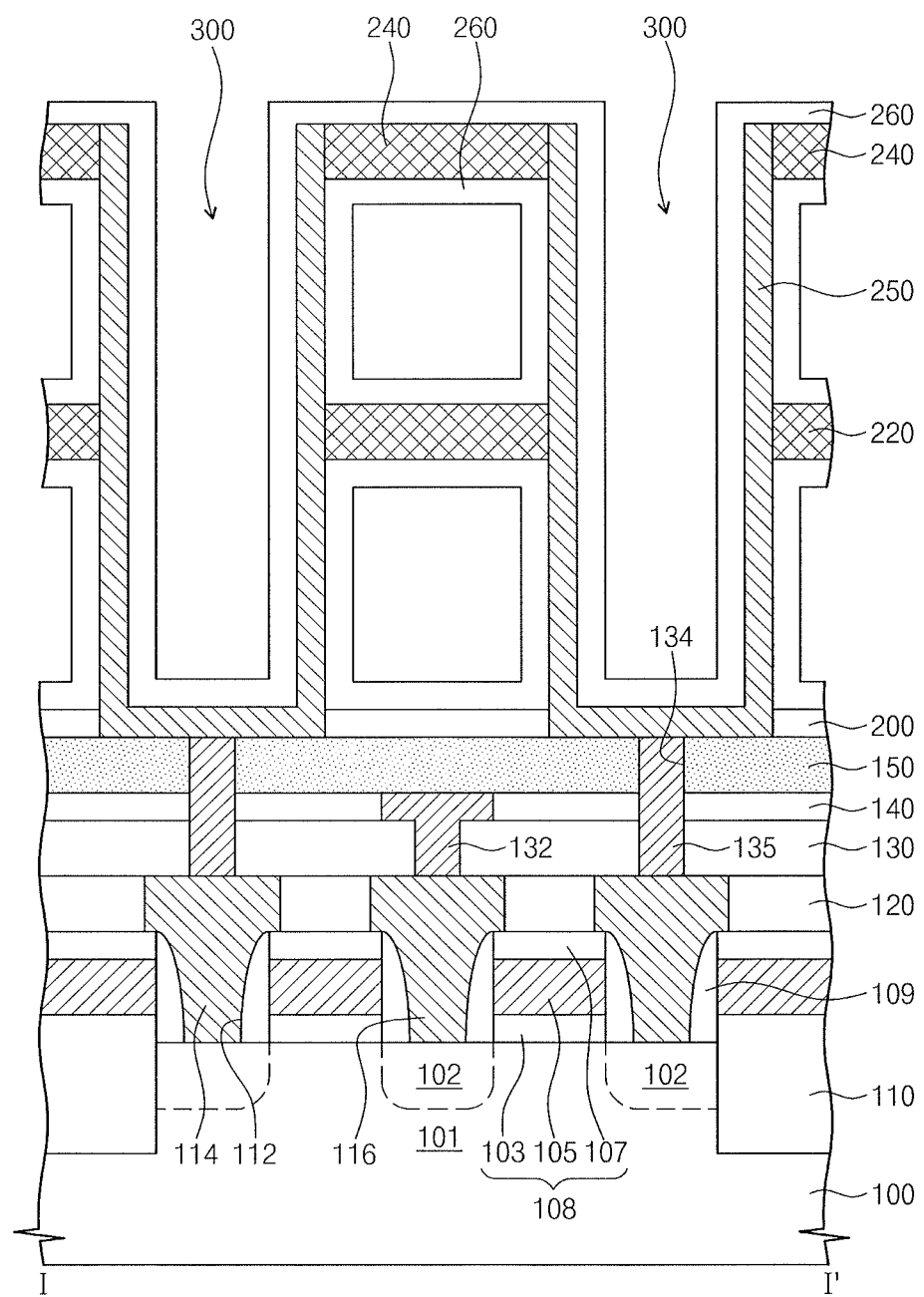

Referring to FIG. 10, a capacitor dielectric 260 may be formed on the resulting structure including the exposed first and second supporting patterns 220 and 240. In some embodiments, the capacitor dielectric 260 may cover conformally the exposed surfaces of the storage nodes 250, the first and second supporting patterns 220 and 240, and the etch stop layer 200. The capacitor dielectric 260 may include at least one layer of an oxide (e.g., silicon oxide), nitride (e.g., silicon nitride), an oxynitride (e.g., silicon oxynitride), and/or a high-k dielectric (e.g., hafnium oxide).

Figure 11:
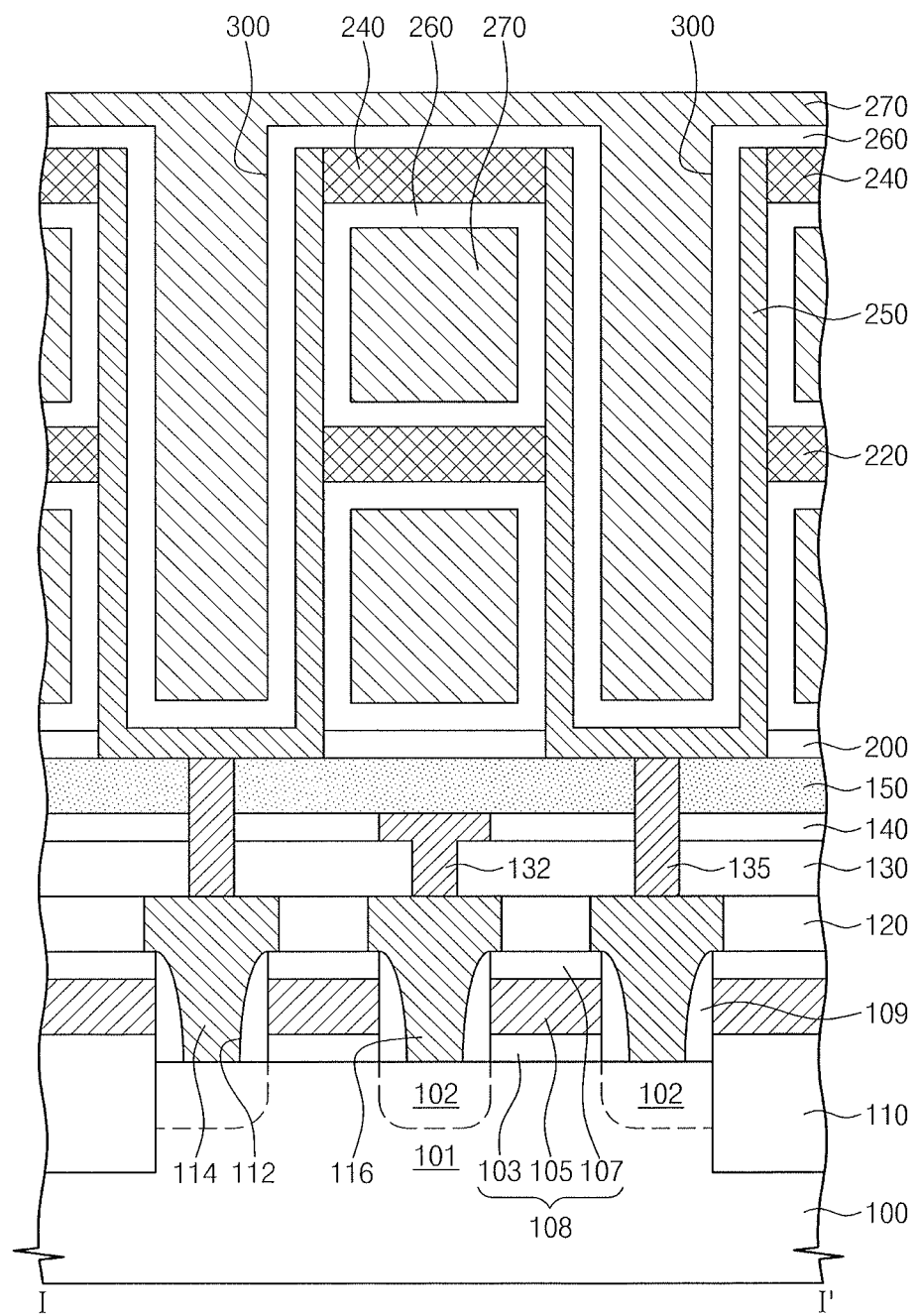

Referring to FIG. 11, an electrode layer 270 may be formed on the capacitor dielectric 260. The electrode layer 270 may be formed to fill a space that is formed by the removal of the first and second mold layers 210 and 230, and to fill the through holes 300. As a result, the capacitor dielectric 260 may be disposed between the electrode layer 270 and the storage nodes 250 and between the electrode layer 270 and the first and second supporting patterns 220 and 240.

The electrode layer 270 may include at least one of a doped semiconductor layer, a conductive metal nitride layer (e.g., of titanium nitride, tantalum nitride, or tungsten nitride), a metal layer (e.g., of ruthenium, iridium, titanium, or tantalum), and a conductive metal oxide layer (e.g., of iridium oxide).

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

Figure 12:
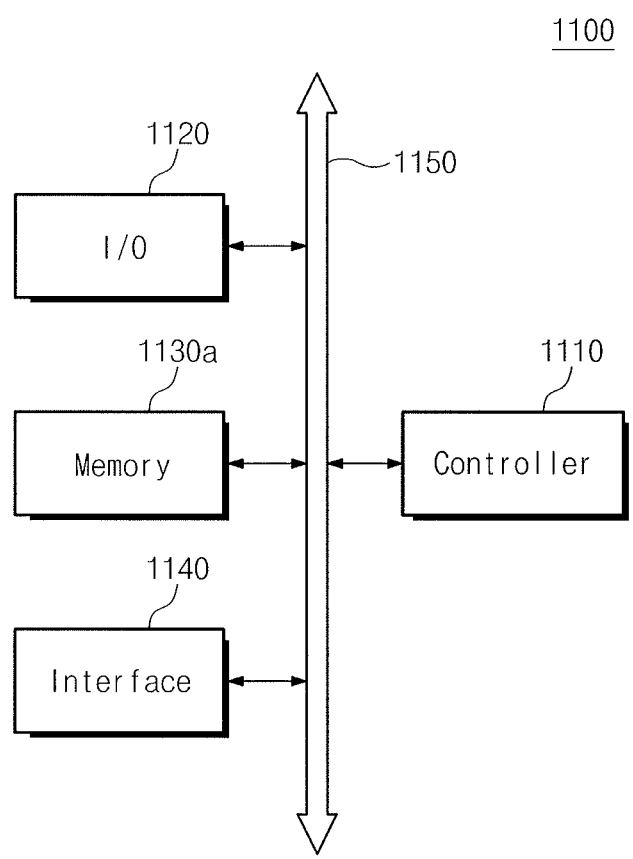
FIG. 12 illustrates a schematic block diagram depicting electronic systems including semiconductor devices according to example embodiments.

FIG. 12 is a schematic block diagram illustrating an example of an electronic system including a semiconductor memory device according to embodiments.

Referring to FIG. 12, an electronic system 1100 according to an embodiment may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include at least one of the semiconductor memory devices according to the embodiments described above. The memory device 1130 may further include other types of semiconductor memory devices that are different from the semiconductor memory devices described above. For example, the memory device 1130 may further include a magnetic memory device, a phase change memory device, a dynamic random access memory (DRAM) device and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data by wireless.

Figure 13:
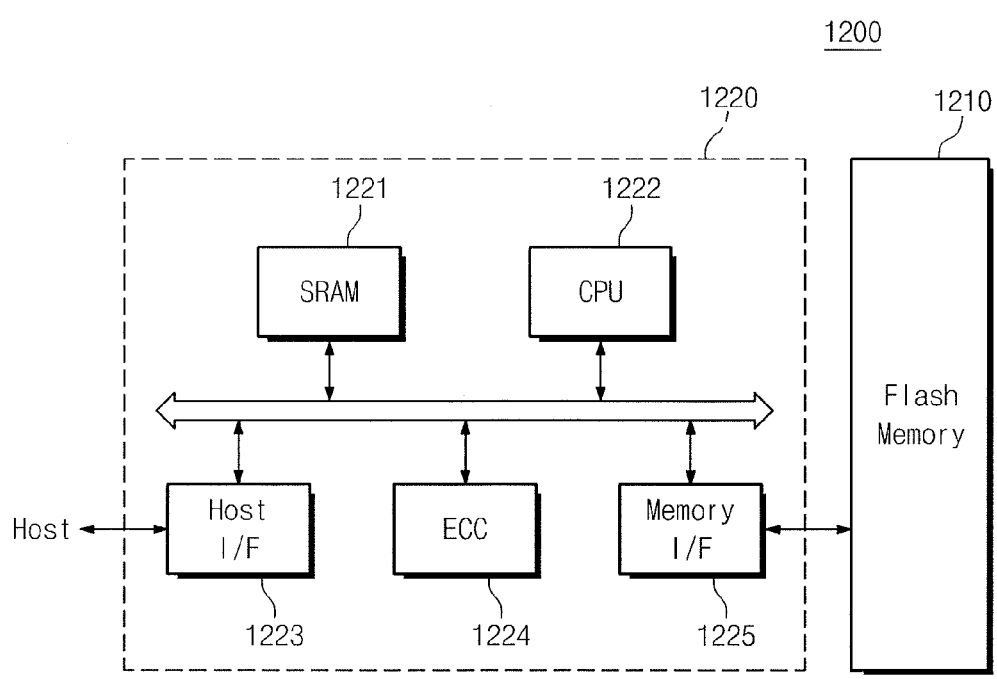
FIG. 13 illustrates a schematic block diagram depicting memory cards including semiconductor devices according to example embodiments.

FIG. 13 is a schematic block diagram illustrating an example of a memory card including a semiconductor memory device according to the embodiments.

Referring to FIG. 13, a memory card 1200 according to an embodiment may include a memory device 1210. The memory device 1210 may include at least one of the semiconductor memory devices according to the various embodiments mentioned above. In other embodiments, the memory device 1210 may further include another type of semiconductor memory device that is different from the semiconductor memory devices according to the embodiments described above. For example, the memory device 1210 may further include a nonvolatile memory device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though (not shown) in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks (SSD) of the computer systems.

By way of summation and review, to meet a growing demand for lightweight, small-sized, high-speed, multifunctional, high-performance, high-reliable, and low-cost electronic devices, it is desirable for a semiconductor memory device to have a high integration density and good reliability. Maximally increasing the capacitance of capacitors may improve the reliability of a semiconductor memory device using such capacitors as memory elements. For example, the capacitance can be increased by increasing an aspect ratio of a capacitor lower electrode. For this reason, research has been carried out to increase an aspect ratio of a capacitor lower electrode.

In general, DRAM devices may include tall and narrow storage nodes provided in a given planar area, to increase an integration density of the DRAIVI device. However, the storage nodes may lean during a subsequent process, such as a spin dry step. As a result, some of the storage nodes may be in contact with each other to make an electric short circuit.

Recently, a method of forming an insulating supporting pattern between the storage nodes has been proposed so as to avoid the leaning of the storage nodes. A method of forming a DRPdVI device may include forming a lower mold layer, a supporting layer, an upper mold layer on a semiconductor substrate, and then etching the upper mold layer, the supporting layer, and the lower mold layer to form a plurality of storage node holes. The etching step for forming the storage node holes may be performed using an etch recipe selected to be able to suppress a polymer from being produced in the etching process. This is because such etch recipe enables the storage node holes to completely penetrate the upper mold layer, the supporting layer, and the lower mold layer.

However, the use of such etch recipe may result in a bowing phenomenon, which refers to a lateral etching of the mold layer that occurs during etching the supporting layer. The bowing phenomenon may reduce an interval between the storage node holes adjacent to each other, and increase possibility of an electric short between the storage nodes.

According to example embodiments, all of the supporting layer and the mold layer may be formed of oxide materials; for example, the supporting layer may be formed of germanium oxide. This may prevent the bowing and tilting phenomena from occurring.

According to example embodiments, the semiconductor memory device may include a storage node that is supported by a supporting pattern including a germanium oxide layer. When the supporting pattern includes the germanium oxide layer, it may be possible to prevent a bowing and tilting phenomenon from occurring during a storage node forming process including etching the supporting pattern and a mold layer.

In addition, an etch stop layer may be formed of a different material from the supporting pattern to prevent the supporting pattern from being etched during etching of the etch stop layer. As a result, it may be possible to reduce process failures, which may occur in a subsequent step of forming the storage node.

Furthermore, the supporting pattern including a germanium oxide layer may not be removed and may be allowed to remain during the storage node forming process including removing the mold layer, such that the supporting pattern may be used as an element supporting the storage node.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A semiconductor memory device, comprising:
   at least one supporting pattern on a substrate;
   a storage node penetrating the supporting pattern;
   an electrode layer disposed around the storage node and the supporting pattern; and
   a capacitor dielectric interposed between the storage node and the electrode layer,
   wherein the supporting pattern includes germanium oxide.

2. The semiconductor memory device as claimed in claim 1, wherein the supporting pattern includes a first supporting pattern in contact with an intermediate portion of the storage node and a second supporting pattern in contact with a top portion of the storage node.

3. The semiconductor memory device as claimed in claim 2, wherein a top surface of the second supporting pattern is coplanar with a top surface of the top portion of the storage node.

4. The semiconductor memory device as claimed in claim 1, wherein:
   the supporting pattern has a plurality of openings, and
   the capacitor dielectric is present on sidewalls of the plurality of openings, a thickness of the capacitor dielectric on the sidewalls of the plurality of openings being smaller than half a width of the plurality of openings.

5. The semiconductor memory device as claimed in claim 1, wherein the storage node has a cylindrical shape.

6. The semiconductor memory device as claimed in claim 1, further comprising an etch stop layer on the substrate, a bottom surface of the etch stop layer being coplanar with a bottom surface of the storage node, and the etch stop layer being of a material different from that of the supporting pattern.

7. The semiconductor memory device as claimed in claim 6, wherein the etch stop layer includes a silicon nitride layer.

8. The semiconductor memory device as claimed in claim 1, further comprising a transistor between the substrate and the storage node, the storage node being electrically connected to the transistor.

9. The semiconductor memory device as claimed in claim 4, wherein the plurality of openings are staggered along a direction.

10. The semiconductor memory device as claimed in claim 4, wherein the plurality of openings are arranged in a pattern in multiple rows, the pattern being staggered in adjacent rows.

11. A semiconductor memory device, comprising:
    a plurality of storage nodes extending perpendicularly from a substrate;
    at least one supporting pattern spaced apart from and parallel to the substrate, the supporting pattern being made of germanium oxide, and the supporting pattern surrounding the storage nodes at a portion thereof and including openings between predetermined ones of the storage nodes;
    an electrode layer disposed around the storage nodes and the supporting pattern; and
    a capacitor dielectric interposed between the storage nodes and the electrode layer and between the supporting pattern and the electrode layer.

12. The semiconductor memory device as claimed in claim 11, wherein the supporting pattern includes a first supporting pattern in contact with an intermediate portion of the storage nodes and a second supporting pattern in contact with a top portion of the storage nodes.

13. The semiconductor memory device as claimed in claim 11, wherein bottom surfaces of the storage nodes contact top surfaces of contact plugs in the substrate.

14. The semiconductor memory device as claimed in claim 13, further including an etch stop layer on the substrate, a lower surface of the etch stop layer being coplanar with the bottom surfaces of the storage node, and the etch stop layer being made of silicon nitride.

15. The semiconductor memory device as claimed in claim 11, wherein the openings are staggered along a direction.

16. The semiconductor memory device as claimed in claim 11, wherein the openings are arranged in a pattern in multiple rows, the pattern being staggered in adjacent rows.

* * * * *